United States Patent
Kreifels

[11] Patent Number: 5,459,355
[45] Date of Patent: Oct. 17, 1995

[54] MULTIPLE LAYER PROGRAMMABLE LAYOUT FOR VERSION IDENTIFICATION

[75] Inventor: Jerry A. Kreifels, Citrus Heights, Calif.

[73] Assignee: Intel Corporation, Santa Clara, Calif.

[21] Appl. No.: 285,495

[22] Filed: Aug. 8, 1994

Related U.S. Application Data

[63] Continuation of Ser. No. 988,236, Dec. 9, 1992, abandoned.

[51] Int. Cl.⁶ .................. H01L 23/485; H01L 23/525
[52] U.S. Cl. ..................... 257/758; 257/208; 257/211
[58] Field of Search ..................... 257/756, 758, 257/759, 210, 203, 207, 208, 211; 307/303, 303.1; 364/488–491

[56] References Cited

U.S. PATENT DOCUMENTS

| | | |
|---|---|---|
| 4,893,167 | 1/1990 | Boudou et al. ............ 257/758 |
| 4,974,048 | 11/1990 | Chakravorty et al. ............ 257/758 |
| 5,070,392 | 12/1991 | Coffey et al. ............ 257/758 |
| 5,157,618 | 10/1992 | Ravindra et al. ............ 364/488 |

Primary Examiner—Robert P. Limanek
Assistant Examiner—David B. Hardy
Attorney, Agent, or Firm—Blakely, Sokoloff, Taylor & Zafman

[57] ABSTRACT

A circuit for providing a read only value for an integrated circuit which integrated circuit includes a plurality of layers of material any one of which may be changed if the integrated circuit is revised comprising a pair of conductors positioned closely adjacent one another in each of the layers of material which carries conductors, a first source of voltage connected to one of the conductors on one of the layers for providing a first binary value, a second source of voltage connected to another of the conductors on one of the layers for providing a second binary value, an output terminal on one of the layers, and apparatus for connecting a selected one of the sources to the output terminal through one of the conductors on each of the layers.

5 Claims, 2 Drawing Sheets

MULTIPLE LAYER PROGRAMMABLE LAYOUT FOR VERSION IDENTIFICATION

This is a continuation of application Ser. No. 07/988,236, filed Dec. 9, 1992, now abandoned.

BACKGROUND OF THE INVENTION

1. Field of the Invention

This invention relates to integrated circuits and, more particularly, to methods and apparatus for providing a multiple layer programmable layout which may be used for the identification of a version of an integrated circuit product.

2. History of the Prior Art

Historically, manufacturers have identified integrated circuits used in personal computers and other products by a code stored in read only memory within the integrated circuits. Typically, this code includes two bytes of information. The first byte is used to identify the manufacturer of the component, and the second byte is used to identify the component. Many computer application programs use this information to determine various details of program operation utilizing that component. Recently, at least one manufacturer has enlarged the available space in read only memory within the integrated circuit and added additional information to the identification information. One piece of information which has been added is a version number. The information is used by the manufacturer for various testing operations. It is very useful to be able to determine the particular version of a product so that tests especially designed for that version of the product may be run. For example, changes in individual masking layers often cause the different versions of a product to consume different amounts of power during test procedures. Unless the particular version of an integrated circuit is known, appropriate full power tests cannot be conducted on the part. Since the version number is presently used only for testing, reading this version number has required a high accessing voltage which is not available in the typical use of the product. Thus the version information is not available during the normal user operations.

To date each entirely new version of a product is given a new version number. The number is typically stored by providing one of two voltage levels at each of a number of external terminals. The particular voltage level represents one of the bits of the version number. The voltage levels are typically provided through hard wired connections to the voltage sources. These connections are usually formed in one of the metal conducting layers.

Changes are made to integrated circuits by changing the mask by which a particular layer is formed. Changes are often made in only a single masking layer because these changes are easy and inexpensive to make. However, prior art circuits typically required that changes be made in a plurality of masking layers in order to change a version number. Because changing a number of masking layers is quite expensive, a version number has not usually been changed in prior art products where only a single layer of the masking for forming the integrated circuit has changed. Consequently, the version number has remained the same until a major change to the integrated circuit is necessary. As is obvious, this is not desirable since appropriate testing cannot be conducted without knowing the layout of each of the layers. A version number is the easiest way to know the makeup of the layers.

SUMMARY OF THE INVENTION

It is, therefore, an object of the present invention to provide an arrangement by which the version number of an integrated circuit may be changed whenever any one of a number of single layer changes occurs.

It is another more specific object of the present invention to provide a new arrangement for providing a version number for use in integrated circuits.

These and other objects of the present invention are realized in a circuit for providing a read only value for an integrated circuit which integrated circuit includes a plurality of layers of material any one of which may be changed if the integrated circuit is revised comprising a pair of conductors in each of the conductive layers of material, a first source of voltage connected to one of the conductors on one of the layers for providing a first binary value, a second source of voltage connected to another of the conductors on one of the layers for providing a second binary value, an output terminal on one of the layers, and means for connecting a selected one of the sources to the output terminal through one of the conductors on each of the layers, the means including means in each layer for exchanging a path used in that layer for carrying voltages from the first and second source of voltages.

These and other objects and features of the invention will be better understood by reference to the detailed description which follows taken together with the drawings in which like elements are referred to by like designations throughout the several views.

DETAILED DESCRIPTION

Figure 1:
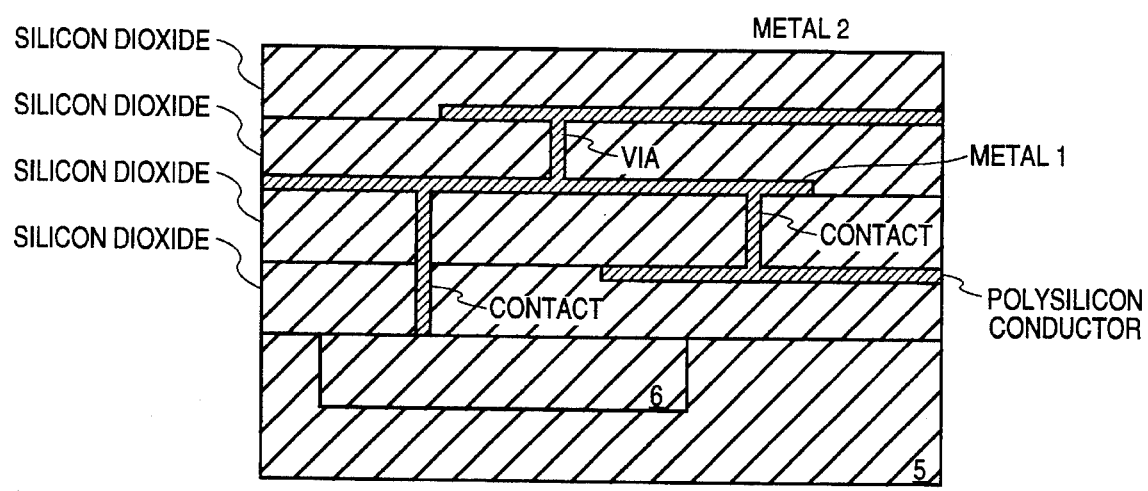
FIG. 1 is a cutaway side view of an integrated circuit useful in understanding the present invention.

Referring now to FIG. 1, there is illustrated a side view of an integrated circuit which has been cut away to illustrate the position of the various elements which form the integrated circuit. The lowest layer 5 illustrated is a layer of silicon material in which various transistor devices are typically created through the diffusion of P and N type dopants. Such transistor devices are not illustrated because they are not important to an understanding of the present invention. However a portion of the wafer 5 includes a diffused material (e.g., is heavily N doped to provide an excess of electrons) which creates a conducting layer 6 which may define different conducting paths within the wafer 5. The particular masking used to define the diffusion determines where the particular conducting paths lie.

On top of the wafer 5 is deposited a layer of silicon dioxide insulating material. On the surface of the silicon dioxide insulating layer is deposited a layer of polysilicon 7 which defines a second set of conductors. Typically, the polysilicon conductors form both gate terminals for transistor devices and conductors leading from those gate terminals such as word lines.

On top of the polysilicon conductors and the first insulating layer of silicon dioxide is deposited a second insulating layer of silicon dioxide. After the deposition of the second insulating layer, an etching mask is placed over the second layer and openings are etched through the insulating layers through which conductive contacts to the diffused conductors and the polysilicon conductors will pass. Then a first layer of metallic conductors (referred to as metal 1) is deposited on top of the second layer of silicon dioxide. This layer is deposited through a mask and fills the openings for conductive contacts where the mask indicates so that connection is made by the conductors of the metal 1 layer to the diffused conductors and the polysilicon conductors.

Another insulating layer of silicon dioxide is deposited on top of the metal 1 layer and etched to provide openings for the conductive via connections between metallic conductors. A second layer of metallic conductors (referred to as metal 2) is then deposited through a mask on top of the upper layer of insulating material. This layer of metallic conducting material makes contact with various conductors of the metal 1 layer through the via openings in the upper insulating layer.

In the embodiment illustrated in FIG. 1, a final insulating layer of silicon dioxide is deposited on top of the metal 2 layer of conductors. Obviously, more or less conductive layers might be used in any particular integrated circuit arrangement.

In prior art integrated circuits which include facilities for providing a version number, the version number has been provided to individual ones of output terminals at which the version number is to be read by connecting each terminal to one or the other of two sources of voltages (typically Vcc and ground) through a conductor in one of the metal layers (metal 1 or metal 2). When a version change involved the masking defining the particular layer in which the metal connections resided by which the version number was transferred off of the chip, then the version number could be changed. However, for changes involving other than that layer, the version number could not be changed without also changing that layer. Consequently, to change a version number in such prior art integrated circuits usually involved revising the masks by which a number of layers were defined. Since this is an expensive process, the version numbers have not usually been changed until the entire integrated circuit is redesigned.

Figure 2:
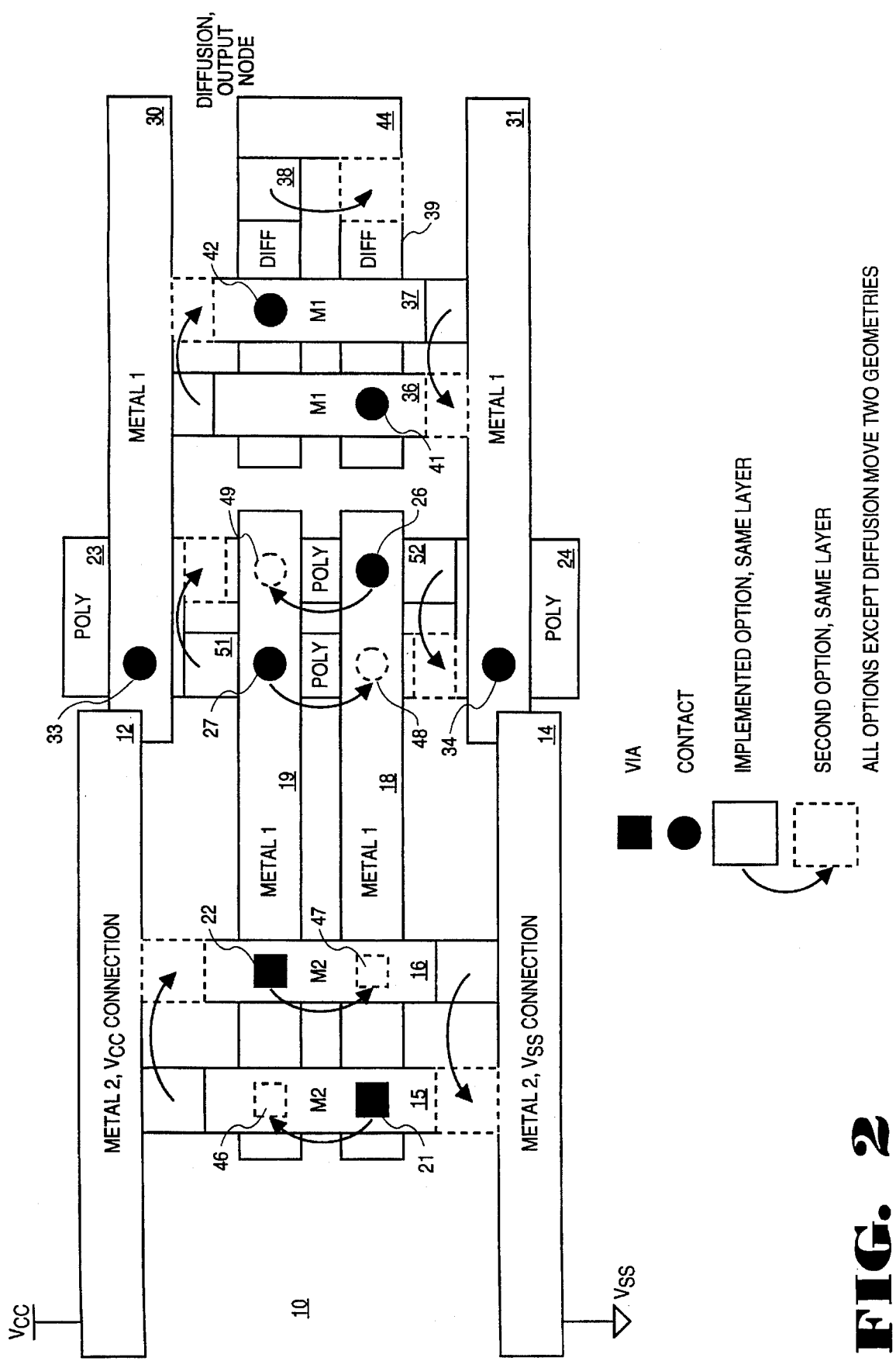
FIG. 2 is a to view of an integrated circuit useful in understanding the present invention.

FIG. 2 illustrates a top view of an integrated circuit 10. The view shows only some of the plurality of layers necessary to provide a complete integrated circuit. However, the layers illustrated do show the layers which provide conductive paths and completely disclose the invention to those skilled in the art of integrated circuit design. In FIG. 2, each of the different types of layers is labelled. At the bottom of FIG. 2 are listed by keys certain of the different layers which are illustrated. For example, a via connection is indicated by a small square, and a contact connection is indicated by a small circle.

As is well known to those skilled in the art and as was explained above with respect to FIG. 1, a diffusion conductor layer is applied to a base layer of the wafer upon which an integrated circuit is constructed by diffusion of particles of a dopant through a mask. The diffused portion of the layer defined by the mask may be used to produce conductive strips running through the base layer. Conductors in a polysilicon layer are defined by masking and lie above and are separated from the diffusion layer by silicon dioxide insulating layers. A metal 1 layer is the first layer of metallic material deposited on the surface of an integrated circuit to produce conductors while a metal 2 layer is a second layer of metallic material deposited to produce conductors. A contact connection is produced by a masking layer in which openings have been placed to allow openings to be etched in one or more silicon dioxide insulating layers so that conductors of the first metallic layer laid over the silicon dioxide insulating layer or layers may make contact through the etched openings with a polysilicon or diffusion conductor in a layer under the metal 1 layer. A via connection is, similarly, formed by a etching openings in an insulating layer to allow conductors in a metal 2 layer to contact conductors in a metal 1 layer. FIG. 2 illustrates a small portion of an integrated circuit 10. The portion illustrated includes circuitry for providing a single bit of what in one embodiment is an eight bit output representing a version number. The invention may be used to vary any value to be presented at output terminals which may change from version to version of the circuit but which remains constant for the version. As may be seen in FIG. 2, a first value of voltage Vcc is connected to one conductor 12 while a second value of voltage Vss is connected to a second conductor 14. In one instance, the value of the voltage Vcc is a positive five volts while the value of the voltage Vss is ground. Each of these voltage values may vary to fit the particular circuitry involved. Each of the conductors 12 and 14 lies in the metal 2 layer of the integrated circuit for which an output value is to be provided. In the particular embodiment illustrated, it is desired to provide the value Vcc at an output terminal to designate the value of one bit of a version number. Consequently, the conductor 12 which is connected to the source Vcc is joined to another conductor 15 which lies in the metal 2 layer. In a like manner, the conductor 14 is connected to a conductor 16 which lies in the metal 2 layer. As may be seen, each of the conductors 15 and 16 is brought close to but does not join the conductor 14 or 12, respectively, which is connected to the other source of potential.

The two conductors 15 and 16 each cross a pair of conductors 8 and 19 which lie in the metal 1 layer. Each of the pair of conductors 18 and 19 are separated from the conductors of the metal 2 layer (except at selected via connections) by an insulating layer of silicon dioxide material in the manner shown in FIG. 1. In the embodiment illustrated in FIG. 2, the conductor 15 is joined to the conductor 18 at an opening in the insulating layer by a via connection 21; and the conductor 16 is joined to the conductor 19 by a via connection 22 at an opening in the insulating layer. This causes the voltage Vcc to be placed on conductor 18 and the voltage Vss to be placed on the conductor 19.

Each of the conductors 18 and 19 crosses both of a first pair of polysilicon conductors 51 and 52. Typically, the conductors 51 and 52 are insulated from the conductors 18 and 19 by a layer of silicon dioxide as is illustrated in FIG. 1. The conductor 18 is joined to the conductor 52 by a contact 26 at an opening in the insulating layer. The conductor 19 is joined to the conductor 51 by a contact 27 at an opening in the insulating layer. This places the voltage Vcc on the conductor 52 and the voltage Vss on the conductor 51. Conductor 51 is connected to a conductor 23 also formed in polysilicon. Similarly, conductor 52 connects to a polysilicon conductor 24.

The polysilicon conductor 23 has a broad upper end portion which crosses and is joined to a conductor 30 of a first pair of conductors 30 and 31 which lie in the metal 1 layer. The conductor 23 is joined to the conductor 30 by a contact 33 at an opening in the insulating layer. The conductor 52 is brought close to but does not contact the broad portion of the conductor 23 which joins the conductor 30. The conductor 24 is joined to the conductor 31 by a contact 34 at an opening in the insulating layer. The conductor 51 is brought close to but does not contact the broad portion of the conductor 24 which joins the conductor 31. This arrangement places the voltage Vcc on the conductor 31 of the metal 1 layer and the voltage Vss on the conductor 30 of the metal 1 layer.

The conductor 30 is directly connected to a conductor 36 of a second pair of conductors which lie in the metal 1 layer. The conductor 31 is directly connected to a conductor 37 of the second pair of conductors which lie in the metal 1 layer. The conductor 36 is brought close to but does not contact the conductor 31. The conductor 37 is brought close to but does not contact the conductor 30. The two conductors 36 and 37 each cross but are insulated from a pair of conductors 38 and 39 which lie in the diffusion layer. The conductor 36 is connected by a contact 41 at an opening in the insulating layers to the conductor 39 while the conductor 37 is connected by a contact 42 at an opening in the insulating layers to the conductor 38. This places the voltage Vcc on the conductor 38 and the voltage Vss on the conductor 39.

The conductor 38 is directly connected to an output terminal 44 in the diffusion layer and thus provides a voltage value of Vcc at the terminal 44. The conductor 39 is brought close to but does not contact the output terminal 44. As may be seen in FIG. 2, each of the conductors in each layer of the integrated circuit 10 carries a voltage from one source and is associated with another conductor in that layer which carries a different voltage from a second source. The two associated conductors in each layer are each arranged to cross both of a pair of conductors in another layer to which a connection may be made. Because of this arrangement, a version number may be changed whenever a change in any one layer of the integrated circuit occurs. For example, if a change is made in the diffusion layer of the integrated circuit 10, a change in the diffusion layer by which the conductor 38 is disconnected from the terminal 44 and the conductor 39 is connected to the terminal 44 changes the value of the output voltage from Vcc to Vss. This is illustrated in FIG. 2 by the arrow which shows a small portion of the conductor 38 being removed to disconnect it from the terminal 44 and a small conductive portion being added to the conductor 39 to connect the conductor 39 to the terminal 44. It should be noted that in the diffusion layer which connects to the terminal 44 on the substrate layer, one of the sources is completely disconnected from the terminal 44. In all other conductive layers, the changes made essentially switch each of the sources to the other conducting path through that layer. Similar changes may be made in the same diffusion layer (by changing the mask producing the layer) as is necessary to circuits representing the other bits of the version number in the diffusion layer to obtain a correct version number.

For example, if a change is made to some element in the metal 1 layer of the integrated circuit 10, a change in conductors of the metal 1 layer may be made to revise the voltage value produced at the output terminal 44. The value at the output terminal 44 may be changed from Vcc to Vss by disconnecting the conductor 36 from the conductor 30 and connecting it to the conductor 31 while disconnecting the conductor 37 from the conductor 31 and connecting it to the conductor 30. The arrows in FIG. 2 illustrate these changes being made. This pair of changes keeps both of the conductors from the sources continuous through the metal 1 layer but interchanges the conductive paths through that layer. Again, similar changes may be made as necessary to circuits representing the other bits of the version number in the diffusion layer (by changing the mask producing that layer) to obtain a correct version number.

Similarly, if a change is made in the metal 2 layer of the integrated circuit 10, a change to the conductors in the metal 2 layer may be made to revise the voltage value produced at the output terminal 44. The value at the output terminal 44 may be changed from Vcc to Vss by disconnecting the conductor 15 from the conductor 12 and connecting it to the conductor 14 while disconnecting the conductor 16 from the conductor 14 and connecting it to the conductor 12 as is shown by the arrows in FIG. 2. This also exchanges the paths taken from the two sources through that layer. Again, similar changes may be made as necessary to circuits representing the other bits of the version number in the diffusion layer to obtain a correct version number.

A change in the polysilicon layer may also be represented by a new version value by changes made only in the polysilicon layer. The arrows in the figure illustrate such a change by which the conductor 51 is disconnected from the conductor 23 and connected to the conductor 24 while the conductor 52 is disconnected from the conductor 24 and connected to the conductor 23. Again, the conductive paths from the two sources remain continuous through the layer but through different physical paths.

In a somewhat similar manner, if a change occurs in the layer which contains the openings through which via connections are made, a change to the mask producing that layer alone will cause the voltages appearing at the output terminal 44 to change to represent a new value. By discontinuing the openings for the via connections 21 and 22 and placing new openings for new via connections 46 and 47 in the layer, the voltage from the source Vss is switched to the output terminal 44 in place of the voltage Vcc. Again, each path is completed from a source through the via layer but by a different physical route which exchanges the voltage ultimately presented at the terminal 44. Similarly, if a change occurs in the layer containing the openings through which the contact connections are made, a change in the mask producing the layer may be made which will cause the voltages appearing at the output terminal 44 to change to represent a new value. By discontinuing the openings for the contacts 26 and 27 and placing new openings for new contacts 48 and 49 in the layer, the voltage from the source Vss is switched to the output terminal 44 instead of the voltage Vcc.

The layout illustrated in FIG. 2 is not necessarily the optimum layout that might be realized in a circuit environment which includes only the elements shown. However, it does illustrate that the invention allows changes to be made to only a single layer of the integrated circuit masking which result in the change of the output voltage signal. By providing a pair of conductors in each conductive layer and associating them with similar paired conductors and contact points in adjoining insulating layers in a manner that the conductive paths through each layer may be exchanged in each layer and providing both of the possible voltage values at some beginning set of paired conductors (usually the upper layer), the version number may be readily changed with any change in any particular layer. In fact, any sequence of single layer changes made to the layers containing conducting circuitry may be met with a change of revision number involving that layer alone. Of course, changes in version number may be made where changes in multiple layers have been made by changing the connections in any one of the layers involved.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. An integrated circuit, comprising:
   (a) a plurality of conductive layers each having a defined layout, wherein a change in said integrated circuit is made by changing said layout of a first layer of said plurality of conductive layers; and
   (b) an identification circuit for providing a read-only value for said integrated circuit, wherein said identification circuit further comprises
      (i) a first voltage source for providing a first voltage level;
      (ii) a second voltage source for providing a second voltage level;
      (iii) an output terminal for receiving one of said first and second voltage levels; and
      (iv) a conductive path routed through each of said plurality of conductive layers in said integrated circuit for selectively connecting said output terminal to one of said first and second voltage sources, wherein said conductive path can be rerouted to connect said output terminal to said second voltage source from said first voltage source when said layout of said first layer of said plurality of conductive layers is changed without changing said layout of any layer of said plurality of layers other than said first layer in said integrated circuit, where said conductive path is rerouted by adding polysilicon to said conductive path at one position and removing polysilicon from said conductive path at a second position on the first layer.

2. The identification circuit in claim 1 where said conductive path is rerouted by further adding metal to said conductive path at one position and removing metal from said conductive path at a second position on the first layer.

3. The identification circuit in claim 1 where said conductive path is rerouted by further adding a diffused area to said conductive path at one position and removing a diffused area from said conductive path at a second position on the first layer.

4. The identification circuit in claim 1 where said conductive path is rerouted by further changing position of a via on said conductive path on the first layer.

5. The identification circuit in claim 1 where said conductive path is rerouted by further changing position of a contact on said conductive path on the first layer.

* * * * *